United States Patent
Schreffler

(10) Patent No.: US 8,918,990 B2
(45) Date of Patent: Dec. 30, 2014

(54) METHOD OF FORMING A SOLDERLESS PRINTED WIRING BOARD

(75) Inventor: Gary J. Schreffler, Winter Park, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 160 days.

(21) Appl. No.: 13/484,321

(22) Filed: May 31, 2012

(65) Prior Publication Data

US 2012/0307465 A1    Dec. 6, 2012

Related U.S. Application Data

(60) Provisional application No. 61/491,964, filed on Jun. 1, 2011.

(51) Int. Cl.
| | | |
|---|---|---|
| H05K 3/30 | (2006.01) | |
| H05K 3/32 | (2006.01) | |
| H05K 1/18 | (2006.01) | |
| H05K 3/12 | (2006.01) | |
| H05K 3/28 | (2006.01) | |

(52) U.S. Cl.
CPC *H05K 3/32* (2013.01); *H05K 1/185* (2013.01); *H05K 3/1258* (2013.01); *H05K 3/281* (2013.01); *H05K 2203/0152* (2013.01); *H05K 2203/0723* (2013.01); *H05K 2203/1469* (2013.01)
USPC ............... 29/841; 29/832; 29/852; 174/260; 174/262; 438/118

(58) Field of Classification Search
CPC ... H01L 21/563; H01L 21/565; H01L 21/568; H05K 3/32; H05K 3/305; H05K 2203/01452; H05K 2203/1469
USPC ........... 29/830–832, 841, 846, 852; 174/259, 174/260, 262; 257/723, 773, 774, 787; 438/118, 127
See application file for complete search history.

(56) References Cited

U.S. PATENT DOCUMENTS 5,841,193 A * 11/1998 Eichelberger ................ 257/723
8,174,109 B2 * 5/2012 Uchiyama ..................... 438/127

OTHER PUBLICATIONS

White Paper, "Robust, Simplified and Solder-Free Assembly Processing of Electronics Products", Verdant Electronics, Inc., Sunnyvale, California, 2007.

* cited by examiner

*Primary Examiner* — Donghai D Nguyen
(74) *Attorney, Agent, or Firm* — Terry M. Sanks, Esq.; Beusse Wolter Sanks & Maire, P.A.

(57) ABSTRACT

A method of forming solder-less printed wiring boards includes attaching a electronic components to a workpiece using an adhesive material. A mold material is added to partially cover the electronic components to form a sub-assembly including the electronic components attached to the mold material and a planar surface on the workpiece side. At least tops of the electronic components extend beyond a height of the mold material. The adhesive material is removed to separate the workpiece and sub-assembly. A first prepreg dielectric is attached to the planar surface of the mold material. First vias are formed in the first prepreg dielectric to expose bondable contacts of the electronic components. The first vias are filled with electrically conductive plugs to provide connections to the bondable contacts of the electronic components. A circuit layer is formed on a surface of the first prepreg dielectric to provide contact to the first plugs.

6 Claims, 2 Drawing Sheets

METHOD OF FORMING A SOLDERLESS PRINTED WIRING BOARD

CROSS REFERENCE TO RELATED APPLICATIONS

This application claims the benefit of Provisional Application Ser. No. 61/491,964, entitled "SOLDERLESS PRINTED WIRING BOARDS" filed Jun. 1, 2011, which is herein incorporated by reference in its entirety.

FIELD

Disclosed embodiments relate to electronic assembly products, such as printed wiring boards (PWBs).

BACKGROUND

Conventional electronic assembly involves placing a plurality of electronic components on wiring or printed circuit boards which include one or more metal interconnect levels having board land pads on their surface. The electronic components are temporarily immobilized by contact to pre-deposited lead (Pb)-based solder paste on the board. The lead-based solder paste is then reflowed at a temperature of about 150 to 180° C. to provide a permanent immobilization and electrical contact between leads, pads or other bonding features on the electronic components and the board land pads.

On Jul. 1, 2006 the European Union Waste Electrical and Electronic Equipment Directive (WEEE) and Restriction of Hazardous Substances Directive (ROHS) came into effect prohibiting the intentional addition of lead and thus lead-based solder to most consumer electronics produced in the European Union. California recently adopted a ROHS law and China has a version as well. Manufacturers in the U.S. may receive tax benefits by reducing the use of lead-based solder.

Military industry can still use lead-based solder. However, military applications only make up about 1% of electronic usage in the world. Because such military usage is so small, electronic assembly suppliers have chosen to ignore the military needs resulting in lead-free or pure tin finished electronic assembled parts for both military and commercial applications. However, because of relatively high temperature processing needed for lead-free or pure tin solder, there is a risk of component damage or tin whisker formation from pure tin which can result in shorts or opens from thermal shock and thermal cycle fatigue-based circuit board failures.

SUMMARY

Disclosed embodiments describe solder-less printed wiring boards (PWBs) and methods for forming the same. In an example method, electronic components are attached onto a flat fixture (workpiece) using a later removable adhesive, such as a water soluble adhesive or alcohol dissolvable adhesive. The electronic components and the workpiece are then molded using a dielectric molding material, such as a high modulus, thermally conductive, and low coefficient of thermal expansion (CTE) dielectric material, to provide a fairly high level of co-planarity.

The height (thickness) of the molding material is selected to provide only partial encapsulation of the electronic components so that at least the tops of the plurality of electronic components extend beyond the height of the molding material. Significantly, disclosed partial encapsulation allows for rework. The minimum amount of molding material is generally set by only what is required for a dimensionally stable sub-assembly. The adhesive is desolved which separates the workpiece from the sub-assembly. A first prepreg (e.g., a polymer-based material such as a reinforced plastic or ceramic) dielectric is attached to the mold material of the sub-assembly opposite to the side of the electronic components.

Vias are formed in the first prepreg dielectric to expose bondable contacts of the electronic components. The vias are filled with plugs comprising an electrically conductive material to connect to the bondable contacts of the plurality of electronic components, and metal traces are formed on a surface of the first prepreg dielectric. The first plurality of metal traces make contact to the first plugs. Multiple layers can be added by repeating the prepreg addition, contact, plug, and trace formation steps.

Disclosed embodiments eliminate all soldering and the encapsulation of all component electrical interfaces, and provide low temperature processing to mitigate whisker growth and thermal shock and thermal cycle fatigue-based board failures. Advantages of disclose embodiments include the elimination of soldering components to the PWB. Disclosed PWBs provide high reliability electronics.

DETAILED DESCRIPTION

Figure 1A:
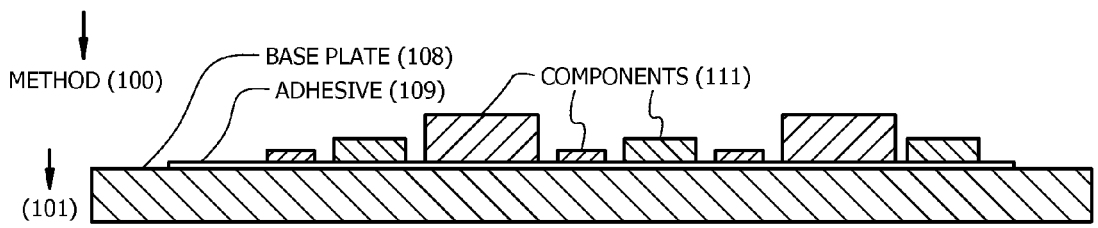
FIGS. 1A-F show successive cross-sectional depictions for an example method of forming solderless printed wiring boards wherein the plurality of electronic components are only partially covered by mold material so that at least tops of the plurality of electronic components extend beyond the height of the mold material, according to an example embodiment.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the term "connected" or "coupled" to is intended to mean either an indirect or direct electrical connection. Thus, if a first device couples to a second device, that connection may be through a direct electrical connection, or through an indirect electrical connection via other devices and connections.

FIGS. 1A-F show successive cross-sectional depictions for an example method 100 of forming solderless PWBs, according to an example embodiment. FIG. 1A shows a depiction after step 101 comprising attaching a plurality of electronic components 111 (e.g., packaged ICs, semiconductor die, and/or discrete devices) onto a workpiece or base plate 108 shown as a "flat fixture" 108 using a removable adhesive 109, such as a water or alcohol soluble adhesive, or a ultraviolet (UV) removable adhesive. In one particular embodiment the adhesive 109 is an acrylic that can be dissolved with a solvent such as acetone. The electronic components 111 can be placed on the workpiece 108 using conventional pick-and-place.

Figure 1B:
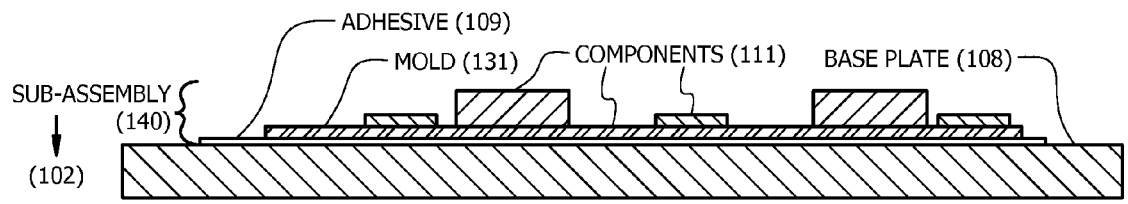

FIG. 1B shows a depiction after step 102 comprising adding a mold material 131 shown having a height (thickness) to only partially cover the plurality of electronic components 111 to form a sub-assembly 140 comprising the plurality of electronic components 111 attached to (potted in) the mold material 131. Mold material generally comprises a high modulus, thermally conductive and low coefficient of thermal expansion (CTE) dielectric material, such as example epoxy-based potting compounds including RESINLAB EP1285 or MASTER BOND EP42HT-2.

The plurality of electronic components 111 can be seen to be only partially covered by the mold material 131 so that at least the tops of the plurality of electronic components 111 extend beyond the height of the mold material 131. The height of the mold material 131 may comprise 10% to 90% of the tallest of the electronic component(s) 111. Significantly, partial encapsulation as disclosed herein allows for limited rework such as mechanically removing the mold material 131 around the "visible" component then grinding, milling or cutting the failed component from the assembly. The assembly is then prepped by reconditioning the exposed pads for component reattachment using conductive adhesive, nano-copper, or solder. In contrast, full encapsulation does not provide for any rework. Advantages of partially encapsulating the electronic components 111 include weight reduction, lower material costs, and better convective cooling of the PWB. The mold material 131 will be permanent (non-sacrificial) material in the completed PWB as described below.

Figure 1C:
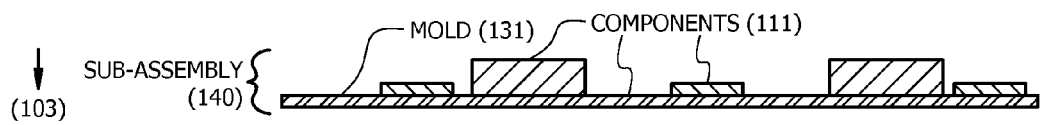
Figure 1D:
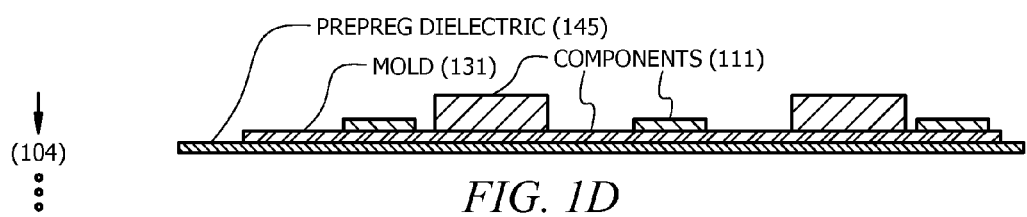
Figure 1E:
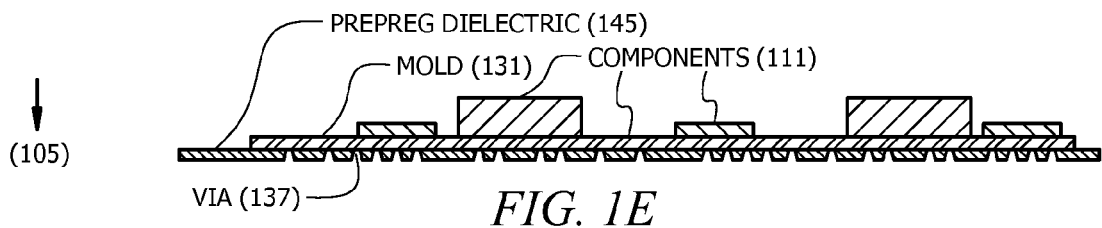

Although not shown, after partial encapsulation the sub-assembly 140, the sub-assembly 140 can be completely encapsulated with a water (or other solvent that does not act on the mold material or exposed components) dissolvable material to create a flat surface to facilitate further processing, which can be later selectively removed (while preserving the mold material 131) after completing the PWB assembly. FIG. 1C shows a depiction after step 103 comprising desolving the adhesive 109 which allows separating the workpiece 108 from the sub-assembly 140. FIG. 1D shows a depiction after step 104 comprising attaching a first prepreg (e.g., a polymer-based material such as a reinforced plastic or ceramic) dielectric 145 to the mold material 131 of the sub-assembly 140. FIG. 1E shows a depiction after step 105 comprising forming a plurality of first vias 137 in the first prepreg dielectric 145 to expose bondable contacts of the plurality of electronic components 111, such as leads, bond pads, or other bondable features. Laser drilling can be used to form the vias 137. The area of laser drill (laser spot size) can match the area of the bonding features of the electronic components, such as leads or bond pads.

Figure 1F:
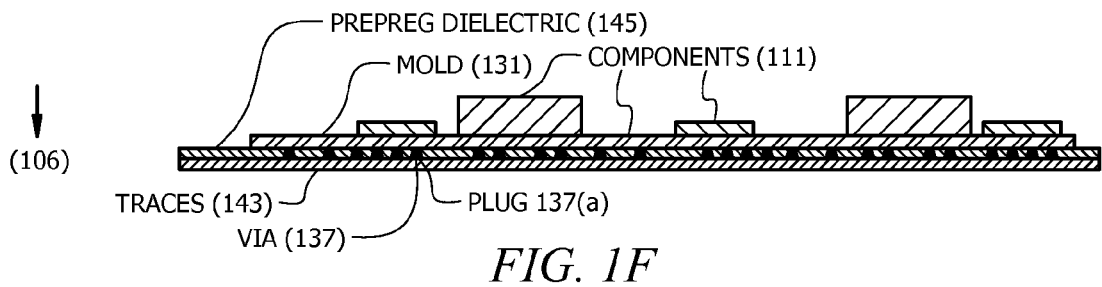

FIG. 1F shows a depiction after step 106 comprising filling the first vias 137 with plugs 137(a) comprising an electrically conductive material (e.g., copper or a copper alloy) to provide an electrical contact through the prepreg dielectric 145 to the bondable contacts of the plurality of electronic components 111 and forming a first plurality of metal traces 143 (the traces are patterned, but not shown patterned in FIG. 1F for simplicity) on a surface of the first prepreg dielectric 145. The first plurality of metal traces 143 make contact to the first plugs 137(a), which can complete the PWB.

Two example low cost processes of conductor formulation are described for step 106. Electrically conductive ink (e.g., a silver ink or nano-copper) can be deposited to fill the vias 137 and deposit ink on the surface of the prepeg dielectric 145. Commercially available dispensing equipment is available to print contiguous lines into the vias 137 and on top of the dielectric 145 Conductor formation can also comprise electroplating to fill the vias with a metal (e.g., copper or a copper alloy) and deposit the metal on the surface of the prepeg dielectric 145, followed by pattern etching Disclosed methods also allow for an additive PWB processing following step 106 to form multi-level circuit assemblies. For example, other levels to the assembly can be added by repeating steps 104-106 described above. It is sometimes not possible for all interconnects to be accomplished in only one conductive layer. Therefore, analogous to multi-level metal interconnect schemes used in integrated circuits (ICs), additional layers can be used to provide additional conductive layer(s) to enable connecting to previously connected component pads and previously un-connected component pads.

Figure 2:
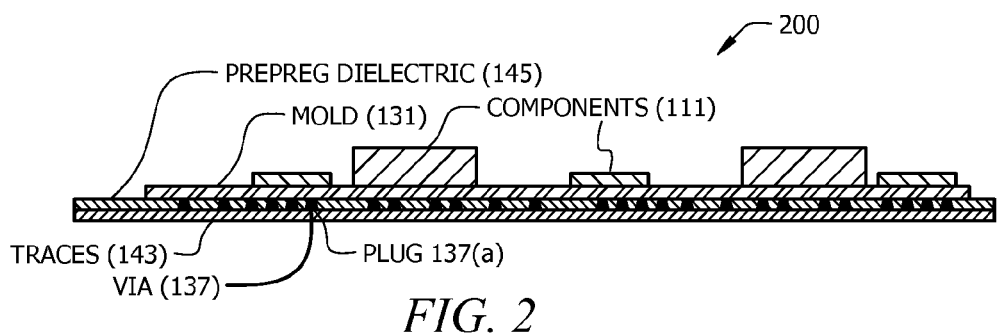
FIG. 2 is a cross-sectional depiction of an example PWB, according to an example embodiment.

FIG. 2 is a cross-sectional depiction of an example PWB 200 according to an example embodiment. PWB 200 features the mold material 131 only partially covering the plurality of electronic components 111, wherein the plurality of electronic components 111 are attached to (potted into) the mold material. At least tops of the plurality of electronic components 111 extend beyond a height of the mold material 131. The prepreg dielectric 145 is on the mold material 131 on a side opposite to the plurality of electronic components 131. A plurality of first vias 137 having plugs 137a comprising an electrically conductive material filling the first vias (137/137a) are in the first prepreg dielectric 145 that expose bondable contacts of the plurality of electronic components 111. A circuit layer 143 comprising a plurality of metal traces 143 are on a surface of the first prepreg dielectric 145. The metal traces 143 make contact to the first plugs 137a.

Advantages of disclosed embodiments include the elimination of soldering components to the PWB, and improved reliability from the low temperature processing, making disclose embodiments suitable for high reliability electronics. As noted above, the partial mold encapsulation aspect for disclosed PWBs provides reworkability. Moreover, there can be a circuit performance improvement due to the shorter interconnect lengths and resulting reduced parasitics including inductance, capacitance and resistance. Commercial applications for disclosed embodiments include for manufacturers of high reliability electronics and/or those that require lead-free electronic assemblies.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

I claim:

1. A method of forming solder-less printed wiring boards, comprising;
    attaching a plurality of electronic components having bondable contacts to a workpiece using an adhesive material;
    adding a mold material to partially cover said plurality of electronic components to form a sub-assembly comprising said plurality of electronic components attached to said mold material and a planar surface on said workpiece, wherein at least tops of said plurality of electronic components extend beyond a height of said mold material;
    after adding said mold material, encapsulating said plurality of electronic components with a dissolvable material different from said mold material to create a flat surface;
    dissolving said adhesive material to separate said workpiece and said sub-assembly;
    attaching a first prepreg dielectric to said planar surface of said mold material of said sub-assembly;
    forming a plurality of first vias in said first prepreg dielectric to expose said bondable contacts of said plurality of electronic components;
    filling said first vias with electrically conductive plugs to provide connections to said bondable contacts of said plurality of electronic components, and
    forming a circuit layer comprising a first plurality of metal traces on a surface of said first prepreg dielectric, wherein said first plurality of metal traces provide contact to said first plugs.

2. The method of claim 1, wherein said adhesive material is a solvent soluble adhesive.

3. The method of claim 1, wherein said forming said plurality of first vias comprises laser drilling.

4. The method of claim 1, wherein said filling said first vias forming and said forming said circuit layer comprises applying copper or a copper alloy.

5. The method of claim 1, wherein said filling said first vias and said forming said circuit layer comprises electroplating.

6. The method of claim 1, further comprising:
    attaching a second prepreg dielectric over said plurality of metal traces on said surface of said first prepreg dielectric;
    forming second vias in said second prepreg dielectric to expose connections to said plurality of metal traces;
    filling said second vias with second plugs comprising an electrically conductive material to connect to said plurality of metal traces, and
    forming a plurality of second metal traces on a surface of said second prepreg dielectric, wherein said second plurality of metal traces contact said second plugs.

* * * * *